(12) United States Patent
Pratsinis et al.

(10) Patent No.: US 6,254,940 B1
(45) Date of Patent: Jul. 3, 2001

(54) ELECTRICALLY ASSISTED SYNTHESIS OF PARTICLES AND FILM WITH PRECISELY CONTROLLED CHARACTERISTIC

(75) Inventors: Sotiris E. Pratsinis, Cincinnati, OH (US); Srinivas Vemury, Duluth, GA (US)

(73) Assignee: University of Cincinnati, Cincinnati, OH (US)

( * ) Notice: Subject to any disclaimer, the term of this patent is extended or adjusted under 35 U.S.C. 154(b) by 0 days.

(21) Appl. No.: 09/214,824

(22) PCT Filed: Jul. 10, 1997

(86) PCT No.: PCT/US97/12006

§ 371 Date: May 26, 1999

§ 102(e) Date: May 26, 1999

(87) PCT Pub. No.: WO98/02241

PCT Pub. Date: Jan. 22, 1998

Related U.S. Application Data

(60) Provisional application No. 60/021,563, filed on Jul. 11, 1996.

(51) Int. Cl.[7] .................................................. C25C 16/453
(52) U.S. Cl. .......................... 427/562; 427/563; 427/564; 427/569; 427/577; 427/578; 427/248.1; 423/613; 423/337; 423/625; 423/608; 423/622; 423/618; 423/289; 423/351; 423/439; 423/447.3; 501/87; 501/96.1
(58) Field of Search ..................................... 427/562, 563, 427/564, 569, 576, 577, 578, 180, 248.1; 423/613, 337, 625, 608, 622, 618, 289, 351, 439, 447.3; 501/87, 96.1

(56) References Cited

U.S. PATENT DOCUMENTS

| | | |
|---|---|---|
| 4,604,118 | 8/1986 | Bocko et al. . |
| 4,891,339 | 1/1990 | Calcote et al. . |
| 4,994,107 | 2/1991 | Flagan et al. . |
| 5,368,825 | 11/1994 | Calcote et al. . |
| 5,494,701 | 2/1996 | Clough et al. . |
| 5,498,446 | 3/1996 | Axelbaum et al. . |
| 5,514,350 | 5/1996 | Kear et al. . |
| 5,698,177 | * 12/1997 | Pratsinis et al. ...................... 423/613 |
| 5,861,132 | * 1/1999 | Pratsinis et al. ...................... 423/613 |

FOREIGN PATENT DOCUMENTS

| | | |
|---|---|---|
| 124901 | * 11/1984 | (EP) . |
| 0 124 901 | 10/1990 | (EP) . |

OTHER PUBLICATIONS

Anderson et al., American Ceramic Society Bulletin, vol. 68, No. 5, May, 1989, pp. 996–1000.*

Katz et al., Twenty–Third Symposium on Combustion/The Combustion Institute, 1990, pp 1733–1738, (no month).*

* cited by examiner

Primary Examiner—Timothy Meeks
(74) Attorney, Agent, or Firm—Wood, Herron & Evans, L.L.P.

(57) ABSTRACT

The present invention related to methods of manufacturing oxide, nitride, carbide, and boride powders and other ceramic, organic, metallic, carbon and alloy powders and films and their mixtures having well-controlled size and crystallinity characteristics. This invention relates, more particularly, to a development in the synthesis of the ceramic, metallic, composite, carbon and alloy nanometer-sized particles with precisely controlled specific surface area, or primary particle size, crystallinity and composition. The product made using the process of the present invention and the use of that product are also claimed herein.

33 Claims, 1 Drawing Sheet

ELECTRICALLY ASSISTED SYNTHESIS OF PARTICLES AND FILM WITH PRECISELY CONTROLLED CHARACTERISTIC

CROSS-REFERENCE TO RELATED APPLICATIONS

This application is a national-stage application based on PCT Application No. US97/12006 entitled Electrically Assisted Synthesis of Particles and Films with Precisely Controlled Characteristics and filed on Jul. 10, 1997, with the present application and the PCT Application claiming the benefit of the filing date of Provisional U.S. Patent Application No. 60/021,563, entitled Electrically Assisted Synthesis of Particles and Films with Precisely Controlled Characteristics and filed on Jul. 11, 1996. The entire disclosure or PCT Application No. US97/12006 and Provisional U.S. Patent Application No. 60/021,563 is incorporated into this application by reference.

The U.S. Government has a paid-up license in this invention and the right in limited circumstances to require the patent owner to license others on reasonable terms as provided for by the terms of Contract No. CTS-8957042 between the National Science Foundation and the University of Cincinnati.

FIELD OF THE INVENTION

The present invention relates to methods of manufacturing titanium dioxide, silicon dioxide, aluminum oxide powders and other ceramic powders having well-controlled size, crystallinity and specific surface area characteristics. The materials produced are useful as catalysts, pigments, reinforcing agents, optical fibers and for producing metallic and alloy powders and nanostructured films. This invention relates, more particularly, to a development in the synthesis of ceramic, metallic and alloy nanometer-sized particles of characteristically high purity and precise particle size through the use of electric fields during particle formation.

BACKGROUND OF THE INVENTION

Fine powder materials synthesis is finding particular application in the fields of powder metallurgy, semiconductors, magnetics and ceramics. In each of these fields, the synthesis of high-purity, nanometer-sized particles or "nano-particles" is considered highly desirable. Primary nanoparticles in the 1–100 nm size range permit the creation of materials with carefully controlled properties. In view of the desirability of the particles, as described, several methods for synthesizing sub-micron particles have been developed.

The generation of fine, pure, uniform, spherical, particles is of intense interest because of their recently recognized properties as suitable starting materials for producing high performance, dense ceramic articles. Densified bodies produced from such powders are predicted to be very strong and to have significantly enhanced property reproducibility. Silicon carbide (SiC) and silicon nitride ($Si_3N_4$) are two ceramic materials currently considered highly suitable for use in advanced military and civilian engines.

The direct synthesis of such ceramic powders from gas phase reactants has been achieved using lasers, RF plasma heating systems and heated flow tubes. The first two methods have the advantage over other methods, such as solid phase synthesis and chemical vapor deposition, of avoiding contact of the reactants or products with hot walls (a source of contamination). The latter two methods suffer from non-uniformities in the size of the reaction zone resulting in the production of undesirable wide particle size distribution, agglomeration, etc. The first system is difficult to scale from the laboratory to a production facility.

Various physical, chemical and mechanical methods have been devised for the synthesis of nanostructured powders (n-powders). These have been described in detail in the scientific literature (see "NanoStructured Materials," Vols. I, II and III, 1992–4). Of particular relevance to this invention is the prior art on the synthesis of n-powders by (1) thermal decomposition of metallo-organic precursors using a focused laser beam, combustion flame or plasma torch as heat source, and (2) evaporation and condensation of volatile species in a reduced-pressure environment.

Nanosized particles have distinctly different properties compared to bulk materials because the number of atoms on the particle surface is comparable to that inside the particle (Andres, R. P., R. S. Averback, W. L. Brown, L. E. Brus, W. A. Goddard III, A. Kaldor, S. G. Louie, M. Moscovits, P. S. Peercy, S. J. Riely, R. W. Siegel, F. Spaepen, and Y. Wang, "Research Opportunities on Cluster and Cluster-Assembled Materials—A Department of Energy, Council on Materials Science Panel Report, *J. Meter. Res.,* 4, 704 (1989)). As a result, these particles are characterized by lower melting point, better light absorption and structural properties. Nanosized particles are also used to form catalysts with high specific surface area and large density of active sites. Though a number of processes have been developed for synthesis of nanoparticles, their production cost remains high, limiting, thus, the development of their applications. Flame reactors, on the other hand, are routinely used in industrial synthesis of submicron powders with relatively narrow size distribution and high purity (Ulrich, G. D., "Flame Synthesis of Fine Particles", *C&EN,* 62(8), 22 (1984)).

Charging particles during their formation can have a profound effect on the product particle characteristics: primary particle size, crystallinity, degree of aggregation and agglomerate size. Hardesty and Weinberg ("Electrical Control of Particulate Pollutants from Flames", *Fourteenth Symposium (International) on Combustion,* The Combustion Institute, Pittsburgh, 1365 (1973)) showed that the silica primary particle size can be reduced by a factor of three when an electric field is applied across a counterflow $CH_4/$air diffusion flame. They attributed it to the rapid deposition of particles on the electrodes, thus decreasing the particle residence time in the high temperature region of the flame. Likewise, Katz and Hung ("Initial Studies of Electric Field Effects on Ceramic Powder Formation in Flames", *Twenty-Third Symposium (International) on Combustion,* The Combustion Institute, Pittsburgh 1733 (1990)) showed that the size of $TiO_2$, $SiO_2$ and $GeO_2$ particles made in a similar reactor were greatly influenced by the presence of electric fields. Xiong et al. (1992) showed theoretically that charging titania particles unipolarly during their synthesis can reduce the particle size and narrow the particle size distribution.

Titania is used as a pigmentary material (Mezey, E. J., "Pigments and Reinforcing Agents" in VAPOR DEPOSITION, C. F. Powell, J. H. Oxley and J. M. Blocher, Jr., (Eds.), John Wiley & Sons, New York, 423 (1966)), photocatalyst (Ollis, D. F., Pelizzetti, E., and N. Serpone, "Photocatalytic Destruction of Water Contaminants", *Environ. Sci. Tech.,* 25, 1523 (1991)), and as a catalyst support (Bankmann et al., 1992). Fumed silica particles are widely used for optical fibers, catalyst supports and as a filler and dispersing agent (Bautista, J. R., and R. M. Atkins, "The Formation and Deposition of $SiO_2$ Aerosols in Optical Fiber Manufacturing Torches", *J. Aerosol Sci.,* 22, 667 (1991)). Nanosized tin oxide powders are used as a semiconductor and gas sensor (Kim, E. U-K., and I. Yasui, "Synthesis of Hydrous $SnO_2$ and $SnO_2$-Coated $TiO_2$ Powders by the Homogeneous Precipitation Method and their Characterization", *J. Mater. Sci.,* 23, 637 (1988)). The objectives of the present invention are to provide methods using plate electrodes across the premixed flame for synthesis of nanophase materials with closely controlled characteristics.

Flame aerosol technology refers to the formation of fine particles from gases in flames. This technology has been practices since prehistoric times as depicted with paintings in cave walls and Chinese ink artwork. Today flame technology is employed routinely in large scale manufacture of carbon blacks and ceramic commodities such as fumed silica and pigmentary titania and, to a lesser extent, for specialty chemicals such as zinc oxide and alumina powders. These powders find most of their applications as pigments and reinforcing agents and, relatively recently, in manufacture of optical waveguides. Today the production volume of this industry is in the order of millions metric tons per year worldwide. Though this is an established industrial process bringing sizable profits to the corresponding corporations, its fundamentals are not yet well understood. This lack of understanding makes truly difficult the process development and scale-up for manufacture of titania, silica and other ceramic particles of closely controlled size including nanoparticles.

According to flame technology, vapor of the precursor compound reacts at high temperature with oxygen or any other desirable oxidant or gas resulting in the product ceramic powder in the form of a cluster of cemented primary particles. The size of primary particles ranges from a few to several hundred nanometers in diameter depending on material and process conditions. In most industrial processes, especially in the oxidation of $SiCl_4$ or $TiCl_4$, these reactions are exothermic so little additional fuel is needed to initiate or sustain the process and the ensuring flame. These powders are collected by conventional means (cyclones and baghouse filters) downstream of the flame reactor as the gas cools down.

The control of particle characteristics during flame synthesis is crucial because the properties of materials made from these particles depend on size and size distribution, morphology, extent of agglomeration and chemical and phase composition. For example, in the manufacture of titania pigments, the goal is to produce a nearly monodisperse rutile phase particle about 250 nm in diameter resulting in maximum hiding powder per unit mass. In contrast, in manufacture of powders for structural ceramics, particle size is not so important. There, agglomerates should be avoided since they result in pores and flaws during sintering reducing, thus, the strength of the final part or specimen made with these particles.

Today oxides like $SiO_2$, $TiO_2$, $Al_2O_3$, $GeO_2$, $V_2O_5$, and most other oxides of metal elements in the periodic table and their composites have been produced in powder form in hydrocarbon flames on a laboratory scale. These powders are made in premixed and coflow or counterflow diffusion flame reactors. More recently, flame processes have been developed for gas phase synthesis of non-oxide powders such as silicon nitride (H. F. Calcote, W. Felder, D. G. Keil, D. B. Olson, *Twenty-third Symposium (Int.) on Combustion,* the Combustion Institute, 1739 (1990)), titanium nitride (I. Glassman, K. A. Davis, K, Brezinsky, *Twenty-fourth Symposium (Int.) on Combustion,* the Combustion Institute, 1877 (1992)), titanium diboride (D. P. Dufaux, R. L. Axelbaum, *Combust. Flame* 100, 350 (1995)), the tungsten carbide (G. Y. Zhao, V. V. S. Revankar, V. Hlavacek, *J. Less Common Metals,* 163 269 (1990)).

Since the early 90s the pace of research has been further intensified with a renewed interest in flame technology for manufacture of advanced materials with emphasis on nanosize particles. Matsoukas and Friedlander, *J. Colloid. Interface Sci.,* 146, 495 (1991), observed that various ceramic particles made at about the same temperature in a premixed flat flame reactor exhibited distinctly different sizes attributing it to their different sintering rates and material properties.

Zachariah and Huzarewicz, *J. Mater. Res.,* 6, 264 (1991), found that flame configuration may have a profound effect on the product powder properties. Specifically, they made submicron $YBa_2Cu_3O_7$ particles by pyrolysis of the corresponding aqueous nitrate salts in an oxy-hydrogen diffusion flame reactor. They found that making these particles in an overventilated coflow diffusion flame resulted in superconducting powders while this was not the case when the particles were made in a premixed flame configuration at the same conditions! More recently, it was found that by merely altering the position of fuel and oxidant streams in methane-air diffusion flame reactors can change the average primary particle size of $TiO_2$ powders made by $TiCl_4$ oxidation by as much as a factor of 10.

The type of metal precursor did not affect the characteristics of $SiO_2$ particles made in a counterflow or in a coflow diffusion flame reactor though it may affect the dynamics of particle growth (M. R. Zachariah and H. G. Semerjian, *High Temperature Science,* 28 113 (1990)). In contrast, during synthesis of $GeO_2$ particles, the precursor can have a profound effect even on the characteristics of product particles. The process temperature has the most drastic effect on process and product characteristics (J. R. Bautista, R. M. Atkins, *J. Aerosol Sci.* 22 667 (1990)). The presence of additives or dopants can have a profound effect on the particle coagulation or sintering rate and subsequently on the characteristics of the product powder (Y. Xiong, S. E. Pratsinis, S. V. R. Mastrangeelo, *J. Colloid Interface Sci.,* 153, 106 (1992)).

The existence of large temperature gradients in a flame can enact strong thermophoretic forces on the newly formed particles drastically altering their residence time at the decisive region where nucleation, growth, coagulation, sintering and oxidation occur affecting thus particle morphology, especially in counterflow laminar diffusion flames (A. Gomez and D. E. Rosner, *Combust. Sci. Technol.* 89, 335 (1993)).

Electrical charges can drastically affect the characteristics of aerosol made powders. Electric fields provide the unique opportunity for making powders with closely controlled specific surface area (D. R. Hardesty, F. J. Weinberg, *Fourteenth Symposium (International) on Combustion,* The Combustion Institute, 907 (1973)).

Patents which discuss the use of flame technology and nanoparticle formation include the following:

U.S. Pat. No. 5,494,701, Clough et al., issued Feb. 27, 1996, discloses processes for coating substrates, in particular substrates including shielded surfaces, with tin oxide-containing coatings. Such processes comprise contacting a substrate with a tin oxide precursor; preferably maintaining the precursor coated substrate at conditions to distribute and equilibrate the coating; oxidizing the precursor containing material to form a substrate containing tin oxide and contacting the substrate with at least one catalyst material at conditions effective to form a catalyst material containing coating on at least a portion of the substrate. Also disclosed are substrates coated with tin oxide-containing coatings for use in various catalyst applications.

U.S. Pat. No. 5,514,350, Kear et al., issued May 7, 1996, discloses an apparatus of forming non-agglomerated nanostructured ceramic (n-ceramic) powders from metallo-organic precursors combines rapid thermal decomposition of a precursor/carrier gas stream in a hot tubular reactor with rapid condensation of the product particles on a cold substrate under a reduced inert gas pressure of 1–50 mbar. A wide variety of metallo-organic precursors is available. The apparatus is particularly suitable for formation of n-SiCxNy powders from hexamethyl-disilizane or the formation of n-ZrOxCy powders from zirconium tertiary butoxide. The n-SiCxNy compounds can be further reacted to form SiC or Si3N4 whiskers, individually or in random-weave form, by heating in a hydrogen or ammonia atmosphere. The non-agglomerated n-ceramic powders form uniformly dense powder compacts by cold pressing which can be sintered to theoretical density at temperatures as low as 0.5 Tm.

U.S. Pat. No. 5,498,446, Axelbaum et al., issued Mar. 12, 1996, discloses a method and apparatus for reacting sodium vapor with gaseous chlorides in a flame to produce nanoscale particles of un-oxidized metals, composites and ceramics. The flame is operated under conditions which lead to condensation of a NaCl by-product onto the particles. The condensate encapsulates the particles and aids in controlling desired particle size and preventing undesirable agglomeration among the particles during synthesis. Following synthesis, oxidation of the particles is inhibited by the encapsulation and handling character of the products is greatly enhanced. Electron microscopy has revealed that synthesized products are composed of discrete nanoparticles in a NaCl matrix. The NaCl encapsulate has been effectively removed from the particles by both washing and known sublimation technique at 800° C. under low pressure.

U.S. Pat. No. 5,368,825, Calcote et al., issued Nov. 29, 1994, discloses a novel process and apparatus for continuously producing very fine, ultrapure ceramic powders from ceramic precursor reactants in a self-sustaining reaction system in the form of a stabilized flame thereof to form ceramic particles and wherein the thus formed ceramic particles are collected in the absence of oxygen.

U.S. Pat. No. 4,994,107, Flagan et al., issued Feb. 19, 1991, discloses a method of producing submicron nonagglomerated particles in a single stage reactor includes introducing a reactant or mixture of reactants at one end while varying the temperature along the reactor to initiate reactions at a low rate. As homogeneously small numbers of seed particles generated in the initial section of the reactor progress through the reactor, the reaction is gradually accelerated through programmed increases in temperature along the length of the reactor to promote particle growth by chemical vapor deposition while minimizing agglomerate formation by maintaining a sufficiently low number concentration of particles in the reactor such that coagulation is inhibited within the residence time of particles in the reactor. The maximum temperature and minimum residence time is defined by a combination of temperature and residence time that is necessary to bring the reaction to completion. In one embodiment, electronic grade silane and high purity nitrogen are introduced into the reactor and temperatures of approximately 770° K. to 1550° K. are employed. In another embodiment silane and ammonia are employed at temperatures from 750° K. to 1800° K.

U.S. Pat. No. 4,891,339, Calcote et al., issued Jan. 2, 1990, discloses a novel process and apparatus for continuously producing very fine, ultrapure ceramic powders from ceramic precursor reactants in a self-sustaining reaction system in the form of a stabilized flame thereof to form ceramic particles and wherein the thus formed ceramic particles are collected in the absence of oxygen.

U.S. Pat. No. 4,604,118, Bocko et al., issued Aug. 5, 1986, discloses a vapor phase method for the synthesis of MgO—$Al_2O_3$—$SiO_2$ products, including MgO—$Al_2O_3$—$SiO_2$ glasses of optical quality, wherein SiCl4, aluminum halide, and organometallic magnesium vapors are oxidized by flame oxidation and the oxides collected and sintered to glass or ceramic products, is described. A added shield gas stream is provided during flame oxidation of the vapors to reduce or prevent $MgCl_2$ by-product formation at the burner and in the product.

The paper "Vapor-Phase Processing of Powders:Plasma Synthesis and Aerosol Decomposition" which appeared in American Ceramic Society Bulletin Vol. 68 (1968) No. 5, pages 996–1000 discloses a glow discharge reactor with a pair of electrodes and a 13.56 MHz Rf power supply. It is described that the electrodes may be flat plate electrodes but a barrel reactor design is preferred. It is also disclosed that with glow discharges the atoms and molecules remain at room temperature.

EP-A-0124901 discloses a process for manufacturing fine powders of metal or ceramic in which a reaction gas is ionised by a high frequency induction coil and heated by laser beams. The heating can be carried out before or after ionisation.

It is an object of the invention to provide a relatively simple, high-production-rate method for effectively synthesizing high purity, nanoparticles of a uniform size in a continuous process. The invention disclosed and claimed herein achieves these advantages in a manner not disclosed or suggested by the prior art.

SUMMARY OF THE INVENTION

The present invention relates to methods of manufacturing oxide, nitride, carbide, and boride powders and other ceramic, metallic, carbon and alloy powders and their mixtures thereof having well-controlled size and surface area characteristics. The materials produced are useful as catalyst, pigments, reinforcing agents, optical fibers, fillers, membranes, films, sensors as well as for synthesis of nanostructured materials. This invention relates, more particularly, to a development in the synthesis of fine ceramic, metallic, composite, carbon and alloy nanometer-sized particles and films with preciselly controlled specific surface area, or primary particle size, crystallinity and composition.

The method of the present invention comprise the steps of: (a) providing a particle precursor reactant in vapor or aerosol phase; (b) converting at least a portion of the particle precursor reactant into ions and product particles by heating the reactant in a reaction area; (c) applying an electric field created by plate electrodes located across the reaction area thereby causing at least some of the ions to charge at least some of the product particles; and (d) collecting the ceramic, composite, organic, metallic, carbon or alloy powder or film formed.

The method enables efficient synthesis of a nanoparticle of characteristically high-purity by applying a plate electrode electric field to the reaction.

One aspect of the novel method resides in closely controlling the characteristics of fine ceramic, carbon, metallic or alloy particles made by various ion generating processes e.g., flames, plasmas, sprays, ionic solutions, and chemical reactions. By appropriate choice of precursor compound(s) and carrier gas, the methods of the present invention may be used to produce powders of almost any desired material, including metals, intermetallics, semiconductors, superconductors, ferroelectrics, composite oxides, organic powders, optically active materials and magnetic materials, as well as their composites.

Preferred metal precursor compounds within the meaning of this invention are one or more from the group $BCl_3$, boric acid esters, boranes, $SiCl_4$, other chlorosilanes, silanes, metal halides, partially hydrated metal halides, metal hydrides, metal alcoholates, metal alkyls, metal amides, metal azides, metal boranates and metal carbonyls.

Preferred additional reactants are one or more selected from the from the group consisting of $H_2$, $NH_3$, hydrazine, amines, alkanes, alkenes, alkines, aryls, $O_2$, air, $NO_2$, $BCl_3$, boric acid esters, boranes, chlorosilanes, silanes, $PCl_5$, phosphoric acid chlorides, phosphoric acid esters, $H_2S$, $SO_2$, $SO_3$, $C_2S$, mercaptans and thioethers.

Nano- or microdisperse (crystalline or amorphous) metal and/or ceramic powders may be prepared in accordance with the process according to the invention, wherein preferred metal and/or ceramic powders, carbides, nitrides, borides, silicides, phosphites, sulphides, oxides and/or combinations thereof of the elements selected from the group consisting of the Group 4b, 5b, 6b, 7b, and 8 transition metals and their mixtures and alloys, or these elements are alone or in combination with one another.

More preferred metal and/or ceramic powders, carbides, nitrides, borides, silicides, phosphites, sulphides, oxides and/or combinations thereof of the elements aluminum ("Al"), boron ("B"), cobalt ("Co"), chromium ("Cr"), iron ("Fe"), germanium ("Ge"), hafnium ("Hf"), lanthanum ("La"), molybdenum ("Mo"), nickel ("Ni"), niobium ("Nb"), palladium ("Pd"), platinum ("Pt"), silicon ("Si"), tin ("Sn"), tantalum ("Ta"), titanium ("Ti"), vanadium ("V"), tungsten ("W"), yttrium ("Y"), zinc ("Zn"), and zirconium ("Zr"),or these elements are alone or in combination with one another.

Suitable metallo-organic compounds include, for example, aluminum, zirconium, yttrium, nickel, titanium, silicon, molybdenum and tungsten silazenes, butoxides, acetyl acetonates, isopropoxides, alkoxides and other metallo-organics available commercially.

In one embodiment, the reaction mixture which is utilized in the present invention may also optionally include a dopant material, in vapor phase, to positively affect the physical attributes of the compound formed.

The present invention has several benefits and advantages. The benefits of the present invention include (a) a method of producing nanoparticles with increased specific surface area (surface area per unit mass); (b) a method of producing nanoparticles with controlled size and increased accuracy; and (c) a method of producing nanoparticles wherein the size and surface area of the particles is easily adjusted.

The present invention is useful for a wide variety of metallo-organic precursors, all of which can be utilized in the process of the present invention to produce nanoparticle ceramic metallic, carbon or alloy powders.

By appropriate choice of precursor compound and carrier gas, the process may be used to produce powders of almost any desired material, including metals, intermetallics, semiconductors, superconductors, ferroelectrics, optically active materials and magnetic materials, as well as their composites.

Accordingly, it is an object of the present invention to provide an improved process and apparatus for the production of ceramic, metallic, carbon or alloy particles of uniform particle size distribution and controlled specific surface area.

Another object of the present invention is to provide an improved process and apparatus for the production of ceramic, metallic, carbon or alloy particles of uniform particle size distribution and uniform composition.

A further object of the present invention is to provide an improved process and apparatus for the production of ceramic, metallic, carbon or alloy particles of uniform particle size distribution under conditions to substantially minimize contamination.

Yet a further object of the present invention is to provide an improved process and apparatus for the production of ultrapure ceramic, metallic, carbon or alloy powders which is readily scalable from the laboratory to a production facility.

Other objects, features and advantages of the present invention will become apparent from the following detailed description. It should be understood, however, that the detailed description and the specific examples, while indicating preferred embodiments of the invention, are given by way of illustration only, since various changes and modifications within the scope of the invention will become apparent to those skilled in the art from this detailed description.

BRIEF DESCRIPTION OF THE DRAWINGS

The features and advantages of the invention will be more fully apparent in view of the drawing, FIG. 1 which is a schematic of the experimental set up.

DETAILED DESCRIPTION OF THE INVENTION

Figure 1:
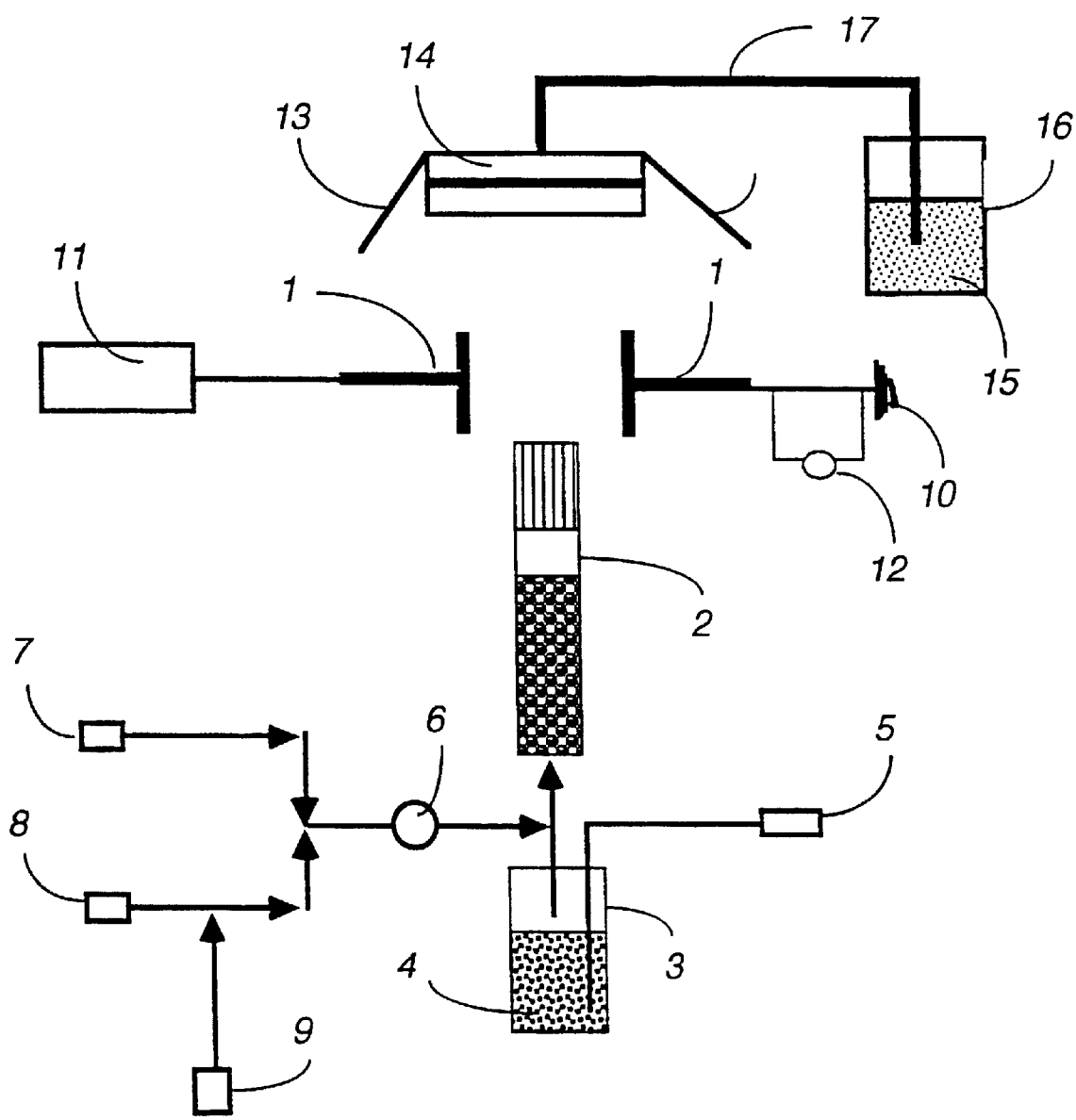

The present invention relates to methods of manufacturing oxide, nitride, carbide, and boride powders and other ceramic, metallic, carbon and alloy powders and their mixtures thereof having well-controlled size and surface area characteristics. The materials produced are useful as catalysts, pigments, reinforcing agents, optical fibers, fillers, membranes, sensors as well as for synthesis of nanostructured materials. This invention relates, more particularly, to a development in the synthesis of fine ceramic, metallic, composite, carbon and alloy nanometer-sized particles with precisely controlled specific surface area, or primary particle size, crystallinity and composition.

The present methods comprise the steps of: (a) mixing reactants in vapor or aerosol phase in a reaction area; (b) heating said mixture in said reaction area; (c) subjecting said heated mixture to an electric field located across the reaction area, said field created by flat-plate electrodes; and (d) collecting the ceramic, metallic, carbon or alloy powder formed.

In one aspect, the novel methods comprise new processes to closely control the characteristics of fine ceramic, carbon, metallic or alloy particles made by various processes generating ions by themselves, e.g., flames, plasmas, sprays, ionic solutions, and chemical reactions. By appropriate choice of precursor compound(s) and carrier gas, the methods of the present invention may be used to produce powders of almost any desired material, including metals, intermetallics, semi-conductors, superconductors, ferroelectrics, composite oxides, organic powders, optically active materials and magnetic materials, as well as their composites.

Preferred metal precursor compounds within the meaning of this invention are one or more from the group $BCl_3$, boric acid esters, boranes, $SiCl_4$, other chlorosilanes, silanes, metal halides, partially hydrated metal halides, metal hydrides, metal alcoholates, metal alkyls, metal amides, metal azides, metal boranates and metal carbonyls.

Preferred additional reagents are one or more selected from the from the group consisting of $H_2$, $NH_3$, hydrazine, amines, alkanes, alkenes, alkines, aryl, $O_2$, air, $NO_2$, $BCl_3$, boric acid esters, boranes, chlorosilanes, silanes, $PCl_5$, phosphoric acid chlorides, phosphoric acid esters, $H_2S$, $SO_2$, $SO_3$, $C_2S$, mercaptans and thioethers.

Nano- or microdisperse (crystalline or amorphous) metal and/or ceramic powders may be prepared in accordance with the process according to the invention, wherein preferred metal and/or ceramic powders, carbides, nitrides, borides, silicides, phosphites, sulphides, oxides and/or combinations thereof of the elements selected from the group consisting of the Group 4b, 5b, 6b, 7b, and 8 transition metals and their mixtures and alloys, or these elements are alone or in combination with one another.

More preferred metal and/or ceramic powders, carbides, nitrides, borides, silicides, phosphites, sulphides, oxides and/or combinations thereof of the elements aluminum ("Al"), boron ("B"), cobalt ("Co"), chromium ("Cr"), iron ("Fe"), germanium ("Ge"), hafnium ("Hf"), lanthanum ("La"), molybdenum ("Mo"), nickel ("Ni"), niobium ("Nb"), palladium ("Pd"), platinum ("Pt"), silicon ("Si"), tin ("Sn"), tantalum ("Ta"), titanium ("Ti"), vanadium ("V"), tungsten ("W"), yttrium ("Y"), zinc ("Zn"), and zirconium ("Zr"), or these elements are alone or in combination with one another.

Suitable metallo-organic compounds include, for example, aluminum, zirconium, yttrium, nickel, titanium, silicon, molybdenum and tungsten silazenes, butoxides, acetyl acetonates, isopropoxides, alkoxides and other metallo-organics available commercially.

In another aspect of the invention, the reaction mixture which is utilized in the present invention may also optionally include a dopant material, in vapor phase, to positively affect the physical attributes of the compound formed.

The product made using the process of the present invention and the use of that product are also claimed herein.

The present invention has several benefits and advantages. The benefits of the present invention include (a) a method of producing nanoparticles with increased specific surface area (surface area per unit mass); (b) a method of producing nanoparticles with controlled size and increased accuracy; and (c) a method of producing nanoparticles wherein the size and surface area of the particles is easily adjusted.

The present invention is useful for a wide variety of metallo-organic precursors, all of which can be utilized in the process of the present invention to produce nanoparticle ceramic metallic, carbon or alloy powders.

The precise details of these steps are set forth below. Although specific executions and examples are discussed in this application, it is envisioned that the present invention encompasses the full range of obvious variants of those specifically disclosed herein. All percentages and ratios given herein are "by weight" unless otherwise specified.

1. Mixing of Reactants

The mixing step takes place in a reactor. (See FIG. 1.) This reactor (2) may encompass any vessel or area in which the reactants (along with any optional dopant) can be mixed in their vapor phase and heated externally. Flame reactors are a preferred class of such reactors. In a flame reactor the reactants are present in the vapor phase and are heated by a flame. An example of such a reactor is a pre-mixed flame reactor in which the various reactants are mixed together prior to being introduced into the flame where the reaction takes place. This type of reactor is known in the art and, for example, is described in George, A. P., et al., Farad. Symp. Chem. Soc., 7:63 (1973), incorporated herein by reference.

Another type of reactor is a diffusion flame reactor (particularly a laminar or turbulent diffusion flame reactor) because it provides a higher quality product by allowing broader control of the reaction conditions. Laminar diffusion flame reactors of the type useful in the present invention are described in Fotou, Pratsinis and Baron, Coating of Silica Fibers by Ultrafine Particles in a Flame Reactor, Chem. Eng. Sci., 49: 1651 (1994) (see especially FIG. 1 and the first paragraph of the Experimental section), and Formenti, et al., in Aerosols and Atmospheric Chemistry, G. M. Hidy, ed, Academic Press, New York, pages 45–55 (1972), both incorporated by reference herein. A laminar diffusion flame reactor, for example, consists of five concentric quartz tubes 1 mm thick. The diameter of the central tube is 2 mm and the spacing between successive tubes is 1 mm. The number of concentric tubes in the reactor and their size can be varied depending upon the requirements of the particular reaction. The design of this reactor is similar to the torches employed in the manufacture of optical fibers as well as in the synthesis of fumed silica. See, Bautista, J. R., et al., J. Aerosol Sci. 22: 667 (1991).

Other types of reactors include, but are not limited to, thermal plasma, laser beam or explosive processes, arc or electron beam processes, infrared furnaces, chemical reaction processes or turbulent flames, such as e.g., a chlorine-oxyhydrogen burner.

The reactor, of course, can be modified in many other ways and still fall within the scope of the present invention.

The reactant(s) is introduced into the reactor in the vapor phase. Any method of providing the reactant(s) in the vapor phase will work in the present invention (e.g., aspiration or aerosolization). It is preferred, however, that the vapor be generated by bubbling an inert gas (5) through liquid reactant (4) e.g., $TiCl_4$, inside a closed vessel (3) and directing that gas (containing $TiCl_4$ vapor) into the reaction are (2). This procedure allows for precise control of flow rate and concentration in the reaction area. As used herein, the term "inert" means that the gas which is used is inert to chemical reactions with $TiCl_4$ and the other reactants defined herein. The gas is also preferably anhydrous. A carrier gas, however, may not be necessary for the transfer of the precursor vapor, especially for large scale synthesis of films and powders.

Typically, the fluidizing gaseous medium is selected to be compatible with the precursor reactants, i.e., to not substantially adversely affect the reaction. Preferred gases for use in this capacity include argon, nitrogen, helium, krypton, chlorine, and mixtures thereof. Particularly preferred for use in the present invention is argon. The gas flow rate will depend upon the reactants, the product size desired and the electric field strength.

When a laminar premixed flame reactor is used in the present invention, the argon gas/reactant(s), vapor is preferably directed through the central tube of the flame reactor. The gas reactant(s) flow rates utilized in the process of the present invention are generally from about 100 $cm^3$/min to about 1 $m^3$/min, and preferably are from about 150 cm3/min to about 250 $cm^3$/min. This flow rate (together with the liquid reactant(s) temperature) essentially defines the concentration of reactant(s) which is present in the reaction area. The reactant(s) vapor concentration ranges (in the reaction area) which are useful in the present invention are from about $7 \times 10^{-5}$ mol/min to about 20 mol/min, and preferably are from about $1 \times 10^{-4}$ mol/min to about $5 \times 10^{-3}$ mol/min. The actual concentration of reactant(s) vapor in the argon gas may be controlled by heating the reactant(s) liquid through which the argon gas is bubbled. The higher the temperature utilized, the greater the reactant(s) vapor concentration achieved. In this regard, it is preferred that the reactant(s) through which the argon is flowed or bubbled has a temperature of from about 10° C. to about 150° C.

The reactant(s)/argon flow rate (together with the flow rates for oxygen, fuel and dopant, if used) helps determine the residence time of the reactants in the reaction area. This residence time affects the characteristics of the product formed. A higher flow rate results in a shorter residence time in the reaction area which results in a larger specific surface area for the product produced. This is counterbalanced by the fact that an increase in the reactant(s) concentration in the reaction area will result in a decrease in the specific surface area of the product formed. Thus, residence time and reactant(s) concentration must be balanced in order to obtain the desired product surface area.

Another optional reactant utilized in the process of the present invention is oxygen gas (9). Oxygen may be introduced into the system in any form, such as pure oxygen, but is preferably introduced into the system as filtered air. Any conventional filtering process may be used. When filtered air is used, its flow rate into the reactor is generally from about 0.3 to about 5.5 L/min, preferably from about 0.5 to about 2.5 L/min. The higher the flow rate of the air (oxygen) entering the reactor, the lower the residence time of the reactants in the reaction area and the larger the surface area of the titanium dioxide formed.

The reaction mixture which is utilized in the present invention may also optionally include a dopant material, in vapor phase, to positively affect the physical attributes of the compound formed. The dopant may either be premixed with the reactant(s) prior to entry into the reaction area or the reactant(s) and the dopant may be mixed in the reaction area. It is preferred that the reactant(s) and the dopant be premixed before they are introduced in the reaction area. In a laminar diffusion flame reactor, therefore, it is preferred that the dopant vapor also be introduced into the central core of the reactor.

Dopants which are useful in the present invention include silicon, phosphorus, germanium, boron, tin, niobium, chromium, silver, gold, palladium, aluminum, and mixtures thereof. Preferably, these dopants are introduced into the system as halides, generally chlorides, although other compounds may be used as long a they are liquids, may be introduced into the reaction system in the vapor phase, and contain the desired dopant element defined above (e.g., organo-metallic compounds may be used). Some of these dopant compounds may become oxides during the course of the reaction. The use of tin or aluminum in the reaction tends to promote the formation of rutile crystalline phase in the titanium dioxide product. In selecting the amount of dopant to be used in the process, it is generally advisable to use the smallest amount of dopant which creates the desired effect.

The dopant is generally, although not necessarily, introduced into the system in the same way that the reactant is. The vapor phase dopant be introduced by bubbling an inert gas (i.e., inert to the particular dopant and other reactants utilized in the process) through the liquid dopant and that the dopant vapor/gas then be directed into the reaction area. Preferred gases for use in that regard include argon, nitrogen, helium, krypton, chlorine, and mixtures thereof. Argon is particularly preferred. The concentration of the dopant material in the reaction zone will depend upon the flow rate of the gas used, as well as on the temperature of the dopant through which the gas is bubbled. In that regard, it is preferred that the flow rate of the dopant be from about 0.1 to about 20% of the product mass. In other embodiements, the dopant may be vaporized and added directly without the aid of a carrier gas.

2. Externally Heating Reaction Mixture

Once the reactant(s) and (and any optional dopant) are present in the reaction area, they are heated via external heating of the reaction area. Any source of heat may be used in the present invention. For example, electrical resistance may be used to heat the reaction area (2). In a flame reactor (such as a premixed flame reactor) the heat is provided by combustion. In the laminar premixed flame reactor, a fuel is fed into the reactor in a sleeve which completely surrounds the reactants being fed into the reactor. Therefore, when the fuel is ignited in the reaction area it is burning essentially at the periphery of the reactants which are being presented in the center of the flame (i.e., the heating is external to the reaction area).

It is preferred that the fuel used in the process of the present invention be any mixture generating ions, e.g., a hydrocarbon material, preferably methane, acetylene, propane, ethane, ethylene, or mixtures thereof. In another embodiment, CO and $H_2$ can be used along with ion generating salts, e.g., NaCl, KCl, CsCl, etc. Methane is the most preferred fuel for use herein. The flame which is utilized in the reaction should be as blue as possible indicating complete combustion of the fuel with very little soot present. The flame generally has a temperature between about 500° K. and about 5000° K.

The presence of water vapor in the reaction area promotes the reaction rates of the precursors and, therefore, is desirable in the present invention. Water vapor forms in situ during some of the embodied combustion processes which is one of the reasons why combustion is the preferred source of heat in the present invention. If a non-combustion heat source is used in the present invention, water vapor can be added to the reaction mixture through the reactor (2).

The fuel is introduced into the reaction area (2) at a rate of from about 100 $cm^3$/min to about 10 $m^3$/min, preferably from about 150 to about 500 $cm^3$/min. The higher the flow rates of the fuel and oxygen entering the reactor, the higher the temperature in the reaction area. Increased fuel and oxygen flow rates also decrease residence time. The effects of fuel (e.g., methane) flow on the final product are controllable but relatively complex. At relatively long residence times, the surface area of the powders formed decreases. At medium residence times, the methane flow rate has little effect on the particle size, while at short residence times, the surface area of the product formed increases with methane flow rate. The flame temperature increases with increasing methane flow rate resulting in a higher sintering rate of particles formed and, hence, the larger particle size (lower surface area). Thus, in general, higher flame temperatures result in both increased particle size and rutile content in the product produced. A check valve (6) may be inserted to prevent backflow of the gases.

3. Flat Plate Electrode Electric Field

In a particularly preferred embodiment of the present invention, an electric field is created across the reaction area where the combustion takes place (i.e., where the particles are formed). For example, this procedure allows for the formation of excellent quality titanium dioxide particles, having high surface area and low rutile (high anatase) content, without requiring the use of the dopant materials described above. The fact that this result can be achieved without using dopants yields a process which is less costly than one which requires dopants, and produces a product which has a higher degree of purity than if dopants were used.

This process can be applied broadly in vapor phase flame generation reactions to form metallic, alloy, carbon and ceramic particles and films, such as silica, titania, alumina, tin oxides, borides, nitrides and carbides. Examples of such materials include metals (iron, aluminum, alloys) and ceramic oxides and their mixtures, such as tin oxide, aluminum oxide (alumina), silicon oxide (silica), chromium oxide, iron oxide, germanium oxide, vanadium oxide, zinc oxide, zirconium oxide, copper oxide or barium oxide. Mixed metal oxides, such as superconductors, can also be prepared. These materials are formed using vapor phase reactions known in the art with the improvement of forming the particles in the presence of an electric field. The process is especially useful in preparing silicon oxides and titanium dioxide, most especially titanium dioxide (titania) in the manner described in the present application.

The characteristics of the electric field utilized (e.g., its location, polarity and strength) can have a significant impact on the properties of the product formed. Specifically, the electric field must be a broad AC or DC electric field in order to achieve the benefits of the present invention. A corona (i.e., a discharge of electricity by a needle-like, point electrode caused when the voltage gradient exceeds a certain critical value) having field lines limited to a narrow region, will not provide the advantages of the present invention since it creates new ions in the process.

The plate electrodes (1) utilized in this embodiment of the present invention are generally in the form of flat squares or rectangles made of an electrically conducting material, such as stainless steel, iron, tin, copper, aluminum, titanium, and mixtures and alloys thereof. It is preferred if the plate is flat but it may be convex/concave. Preferably, one or more stainless steel plates are used, which have a surface area of approximately from about 1 to about 150 cm$^2$, preferably from about 2 to about 100 cm$^2$.

The electrodes (1) are generally placed such that the direction of the electric field is approximately perpendicular to the flow of the reactants, one on each side of the flame with a gap between them where the combustion takes place. Generally, the distance between the tips of the electrodes will be from about 5 to about 100 mm, preferably from about 30 to about 60 mm. The face of the electrodes should be placed outside the flame to minimize corrosion of the electrode tip. Preferably the face of each electrode is placed from about 4 to about 10 mm outside the flame. If the face of the electrodes are placed too far apart, the field strength becomes too weak to affect the reactants. The electrodes may be positioned anywhere on the vertical axis within the reaction (combustion) area (2). However, best results are obtained when the electrodes are placed at the same height as, or lower than, the hottest part of the flame (i.e. at the point where the product particles are actually being formed). This generally means that the electrodes are located from about 0.5 to about 30 mm, particularly from about 1 to about 20 mm, most preferably about 1 mm to about 5 mm, above the mouth of the burner. Positioning the electrodes closer to the burner mouth results in the formation of particles which are smaller (i.e., have increased surface area). The voltage across the electrodes is generally from about 500 V/cm to about 5000 V/cm and is preferably from about 1000 V/cm to about 3000 V/cm While not intending to be bound by theory, it is believed that the electric field operates on the reaction in the following manner. When a needle is used as one of the electrodes, the particles are charged by the electric field across the flame and the ionic wind created across the flame reduces the flame temperature. The interaction between the particle charges and the electric field repels the particles out of the high temperature area quickly resulting in a finer/smaller particle than would have been formed had the particle remained in the high temperature area for a longer period of time. The charged particles then reagglomerate in a lower temperature area (for example, above the flame). In addition, the corona (particularly at higher voltages) acts to flatten the flame as a result of the corona wind effect which results in shorter residence time in the flame. However, with the needle electrodes, the current fluctuates during the reaction indicating that the electric fields created by this electrode configuration are not stable.

Recently, Vemury and Pratsinis ("Corona-Assisted Flame Synthesis of Ultrafine Titania Particles", *Appl. Phys. Lett.*, 66,3275 (1995)) showed that the primary particle size of flame made TiO$_2$ particles by TiCl$_4$ oxidation was decreased from 50 to 30 nm and its crystallinity was drastically altered by applying a unipolar electric field with needle electrodes across a CH$_4$-air diffusion flame. They attributed the observed changes to the particle charging and repulsion and the ionic wind from the needles across the flame, which decreased the particle residence time at high temperatures. Though this study nicely revealed the potential of electric discharge on flame synthesis of powders, it was confined to a single material and a diffusion flame which is hard to characterize for its broad variation of temperature and gas velocities. Furthermore, the ionic wind can have a dramatic effect on the diffusion flame itself since it alters the reactant gas mixing which can alter the product primary particle diameter by as much as a factor of 10 (Pratsinis, S. E., W. Zhu, and S. Vemury, "The Role of Gas Mixing in Flame Synthesis of Titania Powders", *Powder Tech.*, 86, 87 (1996).

Flat plate electrodes do not introduce new ions as with a corona discharge from neddle-shaped electrodes. More specifically, flat plate electrodes attract and effectively separate the positive and negative ions that are formed in the flame. As a result, these flame ions move rapidly towards each electrode of opposite polarity. As they move, they drag neutral gas molecules creating the so-called "ionic wind." This ionic wind "pulls away" the newly formed product particles from the high temperature region of the flame preventing further particle growth. In addition to this effect, the ions, as they move towards the electrodes, also charge the newly formed particles thus slowing down collisions between particles (coagulation) and further growth. (Y. Xiong, S. E. Pratsinis, S. V. R. Mastrangelo, *J. Colloid Interface Sci.* 153, 106 (1992)). Hence, flat plate electrodes charge particles using the ions present in a flame or other heat source rather than introducing new ones as with a corona discharge.

Unlike when needles are used as the electrodes and particles are charged by the corona discharge ("charge spray") of unipolar ions (Payne and Weinberg, *Proc. Royal Soc.*, A250:316 (1959)), no new ions are introduced when plates are used as electrodes. Particles are charged by diffusion charging by the flame ions moving towards the plate electrodes. The electric field across the plates is very stable. The result is finer/smaller particles, more uniform size, and easier and more stable control over particles size.

The electric field using in this preferred embodiment may be unipolar (positive or negative) or bipolar. It is produced using a direct current. In other preferred embodiments, an alternating current ("AC") may be used instead. Any conventional DC power source (11) may be used. To produce a unipolar field, one electrode (1) is connected to the DC power supply (11) (either positive or negative) and the other electrode is connected to the ground (10). For a bipolar field, one electrode is connected to the positive DC power supply (11) and the other electrode is connected to the negative DC power supply (not shown). A voltmeter (12) may be added to monitor voltages. The applied voltages useful in this embodiment of the present invention are from about 0.5 to about 15 kV, preferably from about 1 to about 10 kV. As the voltage increases within these ranges, the particles formed tend to be smaller and, in the case of $TiO_2$, have a higher anatase content. The required (e.g., the minimum voltage required to get the electron avalanche effect and to get an effect on the reaction) and optimum voltages will, of course, vary depending upon the placement and distance between the electrodes (1), the composition of the electrodes and the specifics of the reaction involved. Generally, unipolar fields tend to give better results than bipolar fields. Where the flame has positive charge characteristics, a positive electric field tends to give better results. When a flame has negative charge characteristics, a negative electric field tends to give better results.

In general, with both positive and negative electric fields, the rutile content of the particles formed decreases as the applied voltage increases. The specific surface area of the particles formed increases with increasing voltage between the electrodes (for both unipolar and bipolar fields).

4. Collecting the ceramic, metallic, carbon or alloy powder formed

The final step in the process of the present invention is the collection of the formed. This may be done in many ways known in the art, such as by collection through a filter (14) or on a drum. It is preferred that the powder be collected on a metal (e.g., steel or nickel) plate located just outside the reaction area and placed such that the gases flowing through the reaction area or the air currents around the flame direct the particles formed to the plate. It is preferred that the plate be located from about 2 and about 15 cm, more preferably from about 4 and about 10 cm, above the mouth of the burner. The particles formed may also be collected by a filter, such as a glass fiber filter, which may optionally be aided by a vacuum pump. The collection should take place at a temperature which is lower than the flame temperature.

In controlling the characteristics of the powder formed by the process, it is important to note that there are essentially two key variables in the process: reaction temperature and residence time in the reaction area. The temperature is, of course, controlled in any conventional way (e.g., identity of fuel, flow rate of fuel, flow rate of oxygen). The residence time in the reaction area is controlled based upon flow rates of the reactant(s) vapor, the oxygen (9), the fuel (8) and the dopant (if used) into the reaction area (2): the higher the collective flow rates of these items, the shorter the residence time will be in the reaction area. When the reaction temperature is relatively low (i.e., from about 1100 to about 1500 K) and/or the residence time is relatively short (i.e., from about 0.075 to about 0.1 second, a collective flow rate of from about 1900 to about 2800 $cm^3$/min), the product formed, if titanium dioxide, generally will have a high anatase phase composition and a high surface area making it excellent for use as a photocatalyst. On the other hand, where the residence time of the reactants in the reaction area is relatively long (i.e., from about 0.12 to about 0.5 second, collective flow rate from about 500 to about 1500 $cm^3$/1 min), particularly where the reaction temperature is relatively high (i.e., from about 1100 to about 2000 K, particularly from about 1500 to about 2000 K), the titanium dioxide formed contains a high rutile phase composition and a relatively low surface area.

By manipulating the conditions in the reaction of the present invention, and particularly the reaction temperature and residence time, titanium dioxide powders having a range of anatase phase compositions and specific surface areas can be formed thereby making them useful for a very wide variety of end uses. When the titanium dioxide materials are to be used as catalysts in photocatalysis (photooxidation) reactions, the materials should have a high anatase phase content and a relatively high surface area. Preferred titanium dioxide materials for use in photocatalysis reactions contain at least about 80% anatase phase (up to about 100% anatase phase is possible using the reaction of the present invention) and a specific surface area of at least about 100 $m^2$/gm (preferably from about 100 to about 200 $m^2$/gm, most preferably from about 110 to about 175 $m^2$/gm).

The following examples, which are meant to be illustrative only and are not intended to restrict the scope of the present invention, illustrate the process and the products of the present invention.

EXAMPLES

Example 1

FIG. 1 shows a schematic of the experimental set up. A laminar premixed, burner-stabilized flame reactor (2) is used to make titania, tin oxide and silica particles in the presence or absence of electric field across the flame. The flame is stabilized on the burner mouth using a 2 cm long mullite monolith (Corning) honeycomb with 48 openings/$cm^2$. The burner (alumina tube (Coors), 1.875 cm ID) is packed to ¾ of its length with glass beads (6 mm in diameter) supported on a screen, to provide good mixing of the reactants before they enter the honeycomb. The advantage of using burner-stabilized, premixed, flat flame is the most of the particles experience similar temperatures and gas velocities across the flame.

Clean, dry argon gas (5) (Wright Brothers, 99.8%) is bubbled into the gas washing bottle (3) containing $TiCl_4$ (Aldrich, 99.9%) or $SiCl_4$ (Aldrich, 99%) or $SnCl_4$ (Aldrich, 99%) (4) and premixed with methane (8) (Wright Brothers, 99.8%), oxygen (9) (Matheson, 99.9%) and particle free nitrogen (7) (Wright Brothers, 99.8%) and sent through the burner (2). A check valve (6) is used before the precursor is mixed with the mixture of air and methane so as to prevent any back flow of the flame. In the case of non-stabilized flame reactor, air is used as the oxidant. Oxide particles are formed in the flame by oxidation/hydrolysis of the precursors. The particles are collected on glass fiber filters (14) (Gelman Scientific) for subsequent analysis, in an open faced filter (Graseby/Anderson) kept 10.5 cm from the burner face, by the aid of a vacuum pump.

Stainless steel, plate electrodes (1) [3.8×2.5×0.38 cm (long plates) or 2.5×2.5×0.38 cm (short plates)]are used to create the electric field across the flame. One electrode is connected to the DC power supply(11) (Gamma High Voltage Research, Inc.; Spellman) with reversible polarity and the second one to the ground (10). The distance between the electrodes is 5 cm. The plate electrodes (1) are arranged in such a way that the bottom edge of the plate is in the same plane as the burner face.

The specific surface area of the powder is measured by nitrogen adsorption at 77 K (Gemini 2360, Micromeritics) using the BET equation. Transmission electron micrographs (TEM) of the powders are obtained on a Philips CM 20 or Philips EM 400 microscope operating at 100 kV. X-ray diffraction was used to determine the crystallinity of the powders (D500, Siemens; using $CuK_\alpha$ radiation). The weight fractions of the anatase and rutile phases in the titania samples are obtained by X-ray diffraction (D500, Siemens; using $CuK_\alpha$ radiation) as in Vemury and Pratsinis (1995). A 0.038 cm gauge Pt-Rh themocouple (Omega Engineering) insulated with a mullite sheath is used for measuring the flame temperature, without correction for radiation losses.

1(a) Flame Characterization and Background

First, silica powders are made by $SiCl_4$ oxidation/hydrolysis in a flat, premixed $CH_4$—$O_2$—$N_2$ flame in the absence of an electric field. The air, $O_2$ and $CH_4$ flow rates are 4,300, 240 and 445 $cm^3$/min, respectively, while 100 $cm^3$/min of argon (5) is bubbled through the $SiCl_4$ containing bottle (3). The $SiCl_4$ concentration leaving the bubbler (3) is $1.2 \times 10^{-3}$ mol/min. Under these conditions, the specific surface area of the collected silica particles is 146 $m^2$/g.

The temperature is measured along the axis of the flame in the absence and presence of electric fields in the absence of $SiCl_4$, but with the carrier gas argon flowing through the burner along with 4,500 $cm^3$/min of air and the above flow rates of $CH_4$ and $O_2$. The temperature is measured in the absence of SiCl4 to avoid particle deposition on the tip of the thermocouple and measurement distortion. At an air flow rate of 4,300 $cm^3$/min and in the absence of $SiCl_4$, the flame touches the monolith. To assure that the flame stays above the monolith and avoid its damage, the air flow rate is increase slightly to 4,500 $cm^3$/min. Allendorf et al. (1989) measured the flame temperatures in the absence and presence of the precursor $SiCl_4$ in a diffusion flame reactor using the Raman scattering technique. They found that the flame temperature decreases in the presence of $SiCl_4$. Similarly, in the present experiments, the flame temperatures in the absence of the precursor are expected to be higher.

In the absence of an electric field, the maximum measured temperature is about 1050° C., slightly above the luminous zone of the flame. The temperature quickly drops away from the maximum along the flame axis. Flame temperatures are also measured in the presence of negative electric fields created by the needle and plate electrodes. So as not to disturb the electric field across the flame with the thermocouple, the temperatures are measured more than 5 cm above the electrodes. When the electric field is created by the needles, ionic wind sets in across the flame at the set field strength (−1400 V/cm), dissipating heat by convection. This ionic wind decreases the measured temperature 8 cm away from the burner by as much as 200° C. In contrast, when the electric field is created by the plates (1), no ionic wind is observed and he downstream temperature of the flame is indistinguishable to that measured in the absence of electric fields. The latter observation indicates also that electric fields may have limited effect on the flame chemistry at the employed conditions.

Currents are deduced from the voltage difference measured across a resistance of 0.776 MΩ (12), as a function of the applied field strength across the flame, for negative polarity in the absence of the precursor, $SiCl_4$, but with the carrier gas argon (5) flowing through the reactor (2). The current increases with increasing field strength for all the electrode configurations. In the absence of particles, the currents measured using the plate/plate electrode configuration are the highest. The onset of ionic wind can be observed from a sharp increase in the current when the needle electrode is connected to the DC source. On the other hand, when the needle electrode is used as the ground, the increase in the current is more steady.

When the precursor, $SiCl_4$ is introduced into the flame, the measured currents are much lower than above. This difference is bigger with the plate/plate electrode configuration. In this case, the particles carry the charges from the flame, and the number of ions deposited on the ground decreases, resulting in lower currents. On the other hand, with the needle/needle electrode configuration, the currents obtained in the presence of particles are not substantially different from the ones obtained in the absence of particles since plenty of new charges are introduced by the ionic wind, Acharge spray@ (Payne and Weinberg, 1959). Similar tend is observed in the case of needle/plate electrode combination. Similar measurements are conducted in a positive electric field for all the electrode configurations. The trends of the measured currents are the same for all electrode configurations. The currents, however, are lower by about 10–15% than the ones obtained in the negative electric field (Vemury, 1996).

1(b) Plate/Plate Electrode Configuration

To separate the effect of particle charging from that of ionic wind, needle electrodes are replaced by plates (1). The electric field across the plates is very stable and no ionic wind is observed. The absence of the ionic wind is further corroborated by the fact that the temperature profile downstream from the flame does not change when plates are used as electrodes.

The specific surface area of silica particles is measured as a function of applied field strength across the flame, for both unipolar and bipolar electric fields. As observed earlier, the negative electric field most effectively retards particle growth. Within experimental error, the positive and bipolar electric fields influence the particle growth in a similar fashion. For a given potential across the flame, the increase in the specific surface area of silica particles is less when plates (210 $m^2$/g at 1200 V/cm) are used as the electrodes compared to when needles (260 $m^2$/g at 1200 V/cm) are used as electrodes. Charging can be isolated as the sole reason for retarding the particle growth when plates are used as electrodes. For example, applying a negative electric field of 1600 V/cm reduces the primary particle size of silica made in the absence of electric field by a factor of 2. This is in qualitative agreement with Xiong et al. (1992) who predicted that charges can effectively slow down particle growth by coagulation.

The mechanism by which the particles are charged is different when the electrode configuration is changed from needles to plates. When needles are used as the electrodes, particles are charged by the corona discharge ("charge spray") of unipolar ions (Payne and Weinberg, 1959). On the other hand, when plates are used as the electrodes, no new ions are introduced. However, particles are charged by diffusion charging by the flame ions moving towards the plate electrodes. So, some of the particles leave gas flow and deposit on the electrodes.

A TEM picture is taken of silica agglomerates synthesized at a potential of 1600 V/cm of bipolar electric field with plate/plate electrode configuration. The extent of agglomeration increases under the bipolar electric field compared to particles made in the absence of electric field. A further increase in the extent of agglomeration and a decrease in the primary particle size can be observed at a bipolar electric field of 2000 V/cm. On the other hand, with silica agglomerates made under a positive electric field with a potential of 2000 V/cm generated by the plate/plate electrode configuration, a decrease in the extend of agglomeration and the primary particle size can be observed for the particles made-under the unipolar electric field, although the decrease in the agglomerate size under a unipolar field is more pronounced in the case of needle/needle electrode configuration.

Under a bipolar electric field, the flame is charged partially unipolarly. The local unipolar charging of the flame reduces the primary particle size. However, once these particles leave the high temperature region of the flame, the oppositely charged particles are attracted towards each other, resulting in increased extent of agglomeration. Hence, bipolar charging of particles results in larger agglomerates, which may facilitate efficient particle collection (Gutsch and Löffler, 1994). On the other hand, under a unipolar electric field, particles are unipolarly charged causing a retardation of coagulation by both particle repulsion and electrostatic dispersion, resulting in smaller primary particle and agglomerate sizes. The absence of ionic wind in the plate/plate electrode configuration, makes less effective the reduction in the primary particle size than with the needle/needle electrode configuration.

During the course of the experiments, particles are deposited on the electrode plates (on the anode in the case of negative electric field; on the cathode in the case of positive electric field and on both the plates in the case of a bipolar electric field) by electrostatic dispersion (Kasper, 1981). These particles are collected separately and their specific surface area is similar to that of particles collected on the filter within ±10%. The yield of the silica particles is measured as a function of the applied field strength in the presence of a bipolar electric field. The yield is defined as the ratio of powders collected to that theoretically expected assuming complete conversion of the delivered $SiCl_4$. In the absence of the electric field, the yield is about 50% and remains almost constant with increasing potential giving a further indication of the weak effect of charging on the overall chemistry and yield of the process. Probably, not all $SiCl_4$ is converted to $SiO_2$ at the employed temperature. The yields are slightly higher than the reported values as the particles deposited on the metal parts of the filter assembly are not accounted for. Also, some powders are deposited on the metallic rods attached to the electrodes and these are also not accounted for. Due to the short collection times used in the experiments, the amount of particles collected on the glass chimney (13) was rather low. The fraction of particles deposited on the filter (14) and the electrodes (1) is determined based on the theoretical yield. At a potential of 600 V/cm, no particles are deposited on the electrodes. As the potential is increased, the fraction of the particles deposited on both electrodes increases, up to about 20% of the total particle mass, by electrostatic dispersion (Kasper, 1981). This is in agreement with the theory of electrostatic precipitation of dust particles, where migration of particles dominates the transport to the collector particles (Oglesby and Nichols, 1978). Thus, particle deposition on electrode plates is dominated by the migration of charged particles along the electric field lines generated by the plate electrodes.

EXAMPLE 2

Flame Synthesis of Oxide Powders in the Presence of Electric Fields Created by Needle or Plate Electrodes.

The effect of electric fields on the flame synthesis of nanosized titania, silica and tin oxide particles was investigated in a burner-stabilized premixed, flat flame. Negative electric fields are most effective in affecting the product powder characteristics. When the electric field is created by needle electrodes, ionic wind is generated across the flame decreasing the flame height and resulting in shorter particle residence times at high temperatures. Furthermore, charging of the particles results in electrostatic repulsion and dispersion. These two effects result in reduced coagulation rates. The position of electrodes along the axis of the flame has a strong influence on the particle characteristics. Placing the electrodes closer to the particle inception region (near the burner face) results in reduced growth of the particles. Replacing the needle electrodes with the plate electrodes reduced the ionic wind and the reduction of particle growth is attributed solely to the electrical effects. Increasing the length of the plates reduced the particle size since the particles were charged for prolonged residence times.

The specific-surface area of $TiO_2$ and $SiO_2$ increased with increasing field strength in both flames. On the other hand, the specific surface area of $SnO_2$ powders was not affected. The sintering rates of $TiO_2$ and $SiO_2$ are slow enough for charging to influence the primary particle size, The agglomerate size of $SnO_2$ particles is decreased in the presence of the electric field, even though the effect of electrostatics on the primary particle size is not substantial. The length scales at which electrostatics influence $SnO_2$ particles is on the agglomerate size rather than the primary particle size.

2(a). Flame Synthesis of Oxides in the Absence of Electric Field

First, titania, tin oxide and silica powders are made in the both the flames in the absence of an electric field. The flow rates of $CH_4$, $N_2$ and $O_2$ streams are 455, 3,250 and 1,300 $cm^3$/min, respectively, while 250 $cm^3$/min of argon (5) are bubbled through $TiCl_4$ and $SnCl_4$ (4). The $SiCl_4$ bubbler (3) is kept in ice (at 0° C.) to reduce its vapor pressure and only 200 $cm^3$/min of argon are bubbled through $SiCl_4$. To keep the total gas flow rate the same in all experiments, the $N_2$ flow rate is set to 3,300 $cm^3$/min during silica synthesis. At the argon flow rates employed, the $TiCl_4$, $SnCl_4$ and $SiCl_4$ concentrations leaving the bubbler are $1.75 \times 10^{-4}$, $2.9 \times 10^{-4}$, and $8 \times 10^{-4}$ mol/min, respectively. The specific surface area of $TiO_2$, $SnO_2$, and $SiO_2$ are 50, 20 and 148 $m^2$/g, respectively. The differences in the specific surface area of these oxides synthesized under similar conditions stem from their differences in the sintering rates. Tin oxide has low melting point (1127° C.) and sinters by evaporation-condensation mechanism, while titania sinters by grain boundary diffusion and silica sinters by a viscous sintering mechanism and has anomalously high viscosity.

2(b). Flame Characteristics in the Presence of Electric Fields

Pictures are taken of the flame during synthesis of $SnO_2$ particles at various positive field strengths and electrode configurations. The needle electrodes are kept at 0.1 cm above the burner face. Pictures are also taken of this flame in the absence of any electric field. When an electric field of 1.4 kV/cm is applied across the flame, the flame is visibly affected by the ensuing corona discharge. At low field strengths, the flame tilted towards the negative electrode (cathode). The established current across the electrodes assures equal movement of positive and negative charges: the positive ions must equal the negative ions and electrons. As the positive ions are larger than the electrons, the motion of positive ions "drags" neutral gas molecules creating a net gas movement towards the cathode (Payne and Weinberg, 1959). The flame is positively charged since positively charged hydrocarbon radicals and electrons are formed in the flame during combustion of methane:

$$CH+O \rightarrow CHO^+ + e^{31}$$

The electrons escape from the flame, causing an inhomogeneous distribution of charges in the flame since the electrons are more mobile than the heavier hydrocarbon radicals.

Further increasing the field strength up to 2.2 kV/cm drastically reduces the flame height. At the highest field strength, the flame front is nearly on the burner face, resulting in substantial particle deposition on the monolith. This represents the upper limit of the employed field strength. The reduction of the flame height is attributed to the ionic wind (also known as the Chattock wind or corona wind) flowing across the flame. When a corona discharge is created across a flame, ions flow from the discharging electrode towards the ground electrode. The flow of ions increases with increasing field strength. As these ions move, convection is created across the flame reducing its flame height.

Pictures are also taken of the flame producing $SnO_2$ particles under the electric field created by the plate electrodes (long plates). Under a potential of 1 kV/cm, the flame height is almost the same as that in the absence of electric field, with a slight inclination of the flame toward both cathode and anode, the inclination being more towards the cathode. As the potential is increased to 2 kV/cm, the flame height slightly decreases. When plates are used as the electrodes, the ionic wind is reduced and the flame ions are attracted towards the electrodes. The slight decrease in the flame height is caused by the attraction of the flame ions towards the electrodes.

2(c). Synthesis of Titania Powders

The specific surface area of $TiO_2$ particles is measured as a function of the applied positive or negative field strength created by the needle electrodes across the flat flame. In the absence of electric field, the specific surface area of titania particles is 50 $m^2/g$ and increases to about 85 $m^2/g$ at $-1.8$ kV/cm and to 75 $m^2/g$ at $+1.8$ kV/cm. The specific surface area increases or the primary particle size decreases with increasing applied potential across the flame regardless of the polarity of the electric field. When a unipolar field is applied, the particles are charged unipolarly, causing them to repel each other, resulting in reduced coagulation rates. Furthermore, electrostatic dispersion of unipolarly charged particles reduces their concentration (Kasper, 1981) slowing down further coagulation and, subsequently, particle growth rates. Also, the temperature of the flame decreases in the presence of the ionic wind as discussed above which decreases the sintering rates, resulting in smaller primary particles or powders with high specific surface area.

The negative electric field is more efficient than the positive one in reducing particle growth since it results in smaller particles. A similar effect was observed in diffusion flames by Vemury and Pratsinis (1995). The velocity of the negative ions is 20–50% greater (Adachi et al., 1985) than that of the positive ions, while that of electrons is 1000 times greater (Payne and Weinberg, 1959) resulting in more efficient particle charging (Wiedensohler, 1988). Furthermore, the ionic wind sets in at lower field strengths with negative than with positive polarity. As a result, particle growth by coagulation and coalescence is retarded more effectively with negative than with positive charges. The small reduction in the specific surface area at the highest applied electric field may be attributed to the onset of particle deposition on the burner face. The monotonic increase of specific surface, area with field strength shows that electric fields can be used to control the $TiO_2$ primary particle size from 30 to 18 nm at these conditions.

The specific surface area of titania particles is measured as a function of the applied field strength across the burner-stabilized, flat flame, for positive and negative electric fields using short and long plate electrodes. At a positive field strength of 1.6 kV/cm, the specific surface area of titania particles is about 85 $m^2/g$ and 70 $m^2/g$ using the long and short plates, respectively. The fact that the flame height does not decrease substantially and the temperature downstream of the flame indicate that the observed increase in the particle specific surface area of titania particles is attributed to the electrical effects on particle growth.

At a given field strength, the increase in the specific surface area of titania particles is larger with long electrodes than with short ones: 85 $m^2/g$ with short plate electrodes compared to 115 $m^2/g$ with long plate electrodes at $-1.6$ kV/cm. By applying electric field over longer residence times (long plates) particle collisions and growth are further inhibited. However, further downstream, the temperatures decrease drastically and no further coalescence and sintering of the particles takes place.

Titania exists in three polymorphic forms: rutile (tetragonal), anatase (tetragonal) and brookite (orthorhombic). Rutile is the thermodynamically stable form of $TiO_2$, while anatase and brookite are metastable forms at all temperatures and transform to rutile on heating (Shannon and Pask, 1965). The titania particles made in the burner-stabilized, premixed, flat flame are >99.9 wt.% anatase and the phase composition of these powders does not change as the field strength across the flame is increased.

2(d). Synthesis of Silica Powders

The specific surface area of $SiO_2$ particles made in the premixed flame is measured as a function of the applied field strength using needle electrodes. The specific surface area of $SiO_2$ particles increases from 148 $m^2/g$ in the absence of electric field to about 240 and 220 $m^2/g$ in the presence of 1.6 kV/cm negative and positive electric fields, respectively, across the flat flame. As with titania, the negative electric field is more influential in increasing the specific surface area. Again, it is clearly seen the capacity of electric fields to closely control the silica particle size from 20 to 12 nm.

The specific surface area of $SiO_2$ particles made in the burner-stabilized, flat flame is measured as a function of applied field strength for positive and negative polarities, using both the short and long plate electrodes, to create the electric field. As with titania, the specific surface area of silica particles increases with increasing field strength, with the negative electric field again being more effective in arresting the particle growth. Creating the electric field using longer plate electrodes results in a higher specific surface area at the same applied field strength. Extending the size of the electric field downstream of the flame further influences the particle growth. TEM analysis of silica particles reveals that the agglomerate size decreases with increasing field strength across the flame (Vemury, 1996).

2(e). Synthesis of Tin Oxide Powders

In contrast to the results of $TiO_2$ and $SiO_2$, in the case of the flat flame, the specific surface area of $SnO_2$ particles did not increase and remained at about 20 $m^2/g$ at all field strengths. This is observed when the electric field is created by both needle and plate electrodes. Tin oxide sinters much faster than titania and silica. The fact that the specific surface area of $SnO_2$ particles did not change within experimental error indicates that the sintering of tin oxide particles is completed at a very early stage in the flame. As the grain size increases, the sintering rates decrease and once they reach a certain size, depending on the material, further growth is very slow (Koch and Friedlander, 1990). In the presence of electric field, it is observed that the particles are charged, however, the high sintering rates of tin oxide dominate the electrostatic forces and hence, no change in primary particle characteristics is observed.

The ionic wind across the flame decreases the particle residence time and temperature of the flame, resulting in decreased coagulation rates. Furthermore, electrostatic repulsion and dispersion contribute to a further decrease in the coagulation rates of the particles, resulting in smaller agglomerates with increasing field strength across the flame. Even though the primary particle size of $SnO_2$ agglomerates does not change substantially with increasing field strength across the flame, the agglomerate size decreases. The high sintering rates of $SnO_2$ makes the length scales at which electrostatics become dominant to the size range of agglomerates and not on the primary particle size range.

What is claimed is:

1. A method of forming nanosized particles, comprising the steps of:
   mixing a vapor-phase or aerosol-phase particle precursor reactant with an additional reactant;
   converting at least a portion of the mixed reactants into product particles by heating the mixed reactants in a reaction area, the particle precursor reactant having a flow path into the reaction area, the converting step including heating the mixed reactants in a flame reactor; and
   applying an electric field across the reaction area, the electric field being created by plate electrodes and being substantially perpendicular to the flow path,
   thereby forming nanosized particles.

2. The method of claim 1 further comprising the step of collecting the nanosized particles.

3. The method of claim 1 wherein the nanosized particles are selected from the group consisting of ceramic particles, metallic particles, carbon particles, alloy particles, and combinations thereof.

4. The method of claim 1 wherein the electric field is an AC or DC broad electric field.

5. The method of claim 1 wherein the electric field is unipolar.

6. The method of claim 1 wherein the electric field is bipolar.

7. The method of claim 1 wherein the plate electrodes are flat.

8. The method of claim 1 wherein the plate electrodes are concave.

9. The method of claim 1 wherein the plate electrodes are convex.

10. The method of claim 1 wherein each of the plate electrodes has a face, with each face having a solid surface.

11. The method of claim 1 wherein each plate electrode has a surface area of from about 1 $cm^2$ to about 150 $cm^2$.

12. The method of claim 1 wherein each plate electrode has a surface area of from about 2 $cm^2$ to about 100 $cm^2$.

13. The method of claim 1 wherein each plate electrode has a face, and the distance between the faces of the plate electrodes is from about 5 mm to about 200 mm.

14. The method of claim 1 wherein each plate electrode has a face, and the distance between the faces of the plate electrodes is from about 30 mm to about 60 mm.

15. The method of claim 1 wherein a voltage exists across the plate electrodes, the voltage being from about 500 V/cm to about 5000 V/cm.

16. The method of claim 1 wherein a voltage exists across the plate electrodes, the voltage being from about 1000 V/cm to about 3000 V/cm.

17. The method of claim 1 wherein the electric field has a voltage of from 0.5 W to 15 W.

18. The method of claim 1 wherein the electric field has a voltage of from 1 kV to 10 kV.

19. The method of claim 1 wherein the converting step further includes subjecting the particle precursor reactant to a treatment selected from the group consisting of a plasma, a spray, an ion-generating salt, an ionic solution, a chemical reaction, a laser beam, an arc, an electron beam, an explosive process, an infrared furnace, and combinations thereof.

20. The method of claim 1 wherein each plate electrode has a face, and wherein the heating is accomplished, at least in part, by a flame, the lateral distance between the flame and each face being from about 4 mm to about 10 mm.

21. The method of claim 1 wherein the particle precursor reactant is selected from the group consisting of $BCl_3$, a boric acid ester, a borane, $SiCl_4$, a chlorosilane, a silane, a metal halide, a partially hydrated metal halide, a metal hydride, a metal alcoholate, a metal alkyl, a metal amide, a metal azide, a metal boronate, a metal carbonyl, and combinations thereof.

22. The method of claim 1 wherein the particle precursor reactant and the additional reactant are introduced to the reaction area at a combined rate of from about 100 $cm^3$/min to about 1 $m^3$/min.

23. The method of claim 1 wherein the particle precursor reactant and the additional reactant are introduced to the reaction area at a combined rate of from about 150 $cm^3$/min to about 250 $cm^3$/min.

24. The method of claim 1 wherein the additional reactant is selected from the group consisting of $H_2$, $NH_3$, a hydrazine, an amine, an alkane, an alkene, an alkyne, an aryl, $O_2$, air, $NO_2$, $BCl_3$, a boric acid ester, a borane, a chlorosilane, a silane, $PCl_5$, a phosphoric acid chloride, a phosphoric acid ester, $H_2S$, $SO_2$, $SO_3$, $C_2S$, a mercaptan, a thioether, and combinations thereof.

25. The method of claim 1 further comprising the step of providing a dopant to the reaction area.

26. The method of claim 25 wherein the dopant includes an element selected from the group consisting of silicon, phosphorus, germanium, boron, tin, niobium, chromium, silver, gold, palladium, aluminum, and combinations thereof.

27. The method of claim 1 wherein water is added to the reaction area, thereby promoting the reaction rate of the particle precursor reactant.

28. The method of claim 1 wherein the additional reactant includes a fuel, the fuel being introduced to the reaction area at a rate of about 100 $cm^3$/min to about 10 $m^3$/min.

29. The method of claim 1 wherein the additional reactant includes a fuel, the fuel being introduced to the reaction area at a rate of about 150 $cm^3$/min to about 500 $cm^3$/min.

30. The method of claim 1 wherein the flame reactor is selected from the group consisting of a premixed flame reactor, a turbulent flame reactor, and a laminar diffusion flame reactor.

31. The method of claim 1 wherein the flame has a temperature of from about 500 K to about 5000 K.

32. The method of claim 1 wherein the flame reactor includes a burner having a mouth and a flame extending from the mouth, and wherein the plate electrodes are positioned on opposite sides of the flame at a height above the mouth of the burner at or below the hottest area of the flame.

33. The method of claim 32 wherein the plate electrodes are places from about 0.5 cm to about 30 cm above the mouth of the burner.

* * * * *

UNITED STATES PATENT AND TRADEMARK OFFICE
CERTIFICATE OF CORRECTION

PATENT NO. : 6,254,940 B1
DATED : July 3, 2001
INVENTOR(S) : Sotiris E. Pratsinis et al.

It is certified that error appears in the above-identified patent and that said Letters Patent is hereby corrected as shown below:

Title page, Item [54] and Column 1, lines 2 and 3,
Title, "ELECTRICALLY ASSISTED SYNTHESIS OF PARTICLES AND FILM WITH PRECISELY CONTROLLED CHARACTERISTIC" should read
-- ELECTRICALLY ASSISTED SYNTHESIS OF PARTICLES AND FILMS WITH PRECISELY CONTROLLED CHARACTERISTICS --.

Title page,
Item [57], ABSTRACT,
Lines 1 and 2, "The present invention related to methods of" should read -- The present invention is related to methods of --.
Lines 6 and 7, "synthesis of the ceramic, metallic," should read -- synthesis of fine ceramic, metallic --.

Column 1,
Line 16, "disclosure or PCT" should read -- disclosure of PCT --.

Column 3,
Line 13, "has been practices since" should read -- has been practiced since --.
Line 39, "the ensuring flame" should read -- the ensuing flame --.

Column 5,
Line 17, "SiC or Si3N4 whiskers" should read -- SiC or $Si_3N_4$ whiskers --.

Column 6,
Line 11, "wherein SiCl4," should read -- wherein $SiCl_4$, --.
Line 53, "The method of the present invention comprise the steps" should read -- The method of the present invention comprises the steps --.

Column 7,
Line 16, "selected from the from the group consisting of" should read -- selected from the group consisting of --.
Line 61, "to produce nanoparticle ceramic metallic, carbon or alloy powders." should read -- to produce nanoparticle ceramic, metallic, carbon or alloy powders. --.

Column 8,
Line 18, "which is readily scalable from the laboratory to a production facility" should read -- which are readily scalable from the laboratory to a production facility --.
Line 30, "THE DRAWINGS" should read -- THE DRAWING --.

UNITED STATES PATENT AND TRADEMARK OFFICE
CERTIFICATE OF CORRECTION

PATENT NO. : 6,254,940 B1
DATED : July 3, 2001
INVENTOR(S) : Sotiris E. Pratsinis et al.

It is certified that error appears in the above-identified patent and that said Letters Patent is hereby corrected as shown below:

Column 9,
Line 8, "selected from the from the group consisting of" should read -- selected from the group consisting of --.
Line 56, "produce nanoparticle ceramic metallic, carbon or alloy powders" should read -- produce nanoparticle ceramic, metallic, carbon or alloy powders --.

Column 10,
Line 45, "into the reaction are (2)." should read -- into the reaction area (2). --.
Line 66, "160 cm3/min to" should read -- 150cm$^3$/min to --.

Signed and Sealed this

Twelfth Day of November, 2002

Attest:

Attesting Officer

JAMES E. ROGAN
Director of the United States Patent and Trademark Office